(12) United States Patent
Ioannou et al.

(10) Patent No.: US 7,112,808 B2
(45) Date of Patent: Sep. 26, 2006

(54) WAFER 2D SCAN MECHANISM

(75) Inventors: Michael Ioannou, Acton, MA (US);
Mehran Asdigha, Shrewsbury, MA (US); Joseph Ferrara, Middleton, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 38 days.

(21) Appl. No.: 10/786,660

(22) Filed: Feb. 25, 2004

(65) Prior Publication Data
US 2005/0184253 A1    Aug. 25, 2005

(51) Int. Cl.
*G21K 5/10*    (2006.01)

(52) U.S. Cl. .................. 250/492.21; 250/442.11; 395/80

(58) Field of Classification Search ............ 250/492.21
See application file for complete search history.

(56) References Cited

U.S. PATENT DOCUMENTS

| | | | |
|---|---|---|---|
| 4,736,107 A | | 4/1988 | Myron |
| 5,486,080 A | | 1/1996 | Sieradzki |
| 5,737,500 A | * | 4/1998 | Seraji et al. ............... 700/251 |
| 5,741,113 A | * | 4/1998 | Bacchi et al. ............ 414/744.5 |
| 5,746,565 A | | 5/1998 | Tepolt |
| 6,384,418 B1 | | 5/2002 | Fujii et al. |
| 6,428,266 B1 | * | 8/2002 | Solomon et al. ......... 414/744.4 |
| 6,429,442 B1 | | 8/2002 | Tomita et al. |
| 6,515,288 B1 | | 2/2003 | Ryding et al. |
| 6,580,083 B1 | | 6/2003 | Berrian |
| 6,777,687 B1 | | 8/2004 | Vanderpot et al. |
| 6,953,942 B1 | | 10/2005 | Graf et al. |
| 2001/0032937 A1 | | 10/2001 | Berrian |
| 2003/0068215 A1 | | 4/2003 | Mori et al. |
| 2003/0123958 A1 | * | 7/2003 | Sieradzki et al. ........... 414/217 |

(Continued)

FOREIGN PATENT DOCUMENTS

| EP | 1 047 101 A2 | 10/2000 |
|---|---|---|
| EP | 1 056 114 A2 | 11/2000 |

(Continued)

OTHER PUBLICATIONS

International Search Report, Int'l Application No. PCT/US2005/011497, Int'l Filing Date May 4, 2005, 2 pgs.

(Continued)

*Primary Examiner*—Nikita Wells
*Assistant Examiner*—Phillip A. Johnston
(74) *Attorney, Agent, or Firm*—Eschweiler & Associates, LLC

(57) ABSTRACT

The present invention is directed to a scanning apparatus and method for processing a substrate, wherein the scanning apparatus comprises a base portion and a rotary subsystem. The rotary subsystem comprises a first link comprising a first joint, wherein the first link is rotatably coupled to the base portion by the first joint, and a second link comprising a second joint, wherein the second link is rotatably coupled to the first link by the second joint. The first joint and the second joint are spaced a predetermined distance from one another. The second link further comprising an end effector whereon the substrate resides, and wherein the end effector is operably coupled to the second link. The end effector is further spaced from the second joint by the predetermined distance, wherein a rotation of the first link and second link in a respective first direction and second direction is operable to linearly oscillate the end effector along a linear first scan path, and wherein the rotational velocity of the first link and second link does not cross zero.

21 Claims, 15 Drawing Sheets

U.S. PATENT DOCUMENTS

| | | |
|---|---|---|
| 2003/0192474 A1 | 10/2003 | Smick et al. |
| 2004/0058513 A1 | 3/2004 | Murrell et al. |
| 2004/0191931 A1 | 9/2004 | Murrell et al. |
| 2005/0184253 A1 | 8/2005 | Ioannou et al. |

FOREIGN PATENT DOCUMENTS

| | | |
|---|---|---|
| JP | 11 007 915 | 1/1999 |
| WO | WO 00/05744 A1 | 2/2000 |
| WO | WO 2004/001789 A2 | 12/2003 |

OTHER PUBLICATIONS

International Search Report, Int'l Application No. PCT/US2005/011581, Int'l Filing Date May 4, 2005, 2pgs.

* cited by examiner

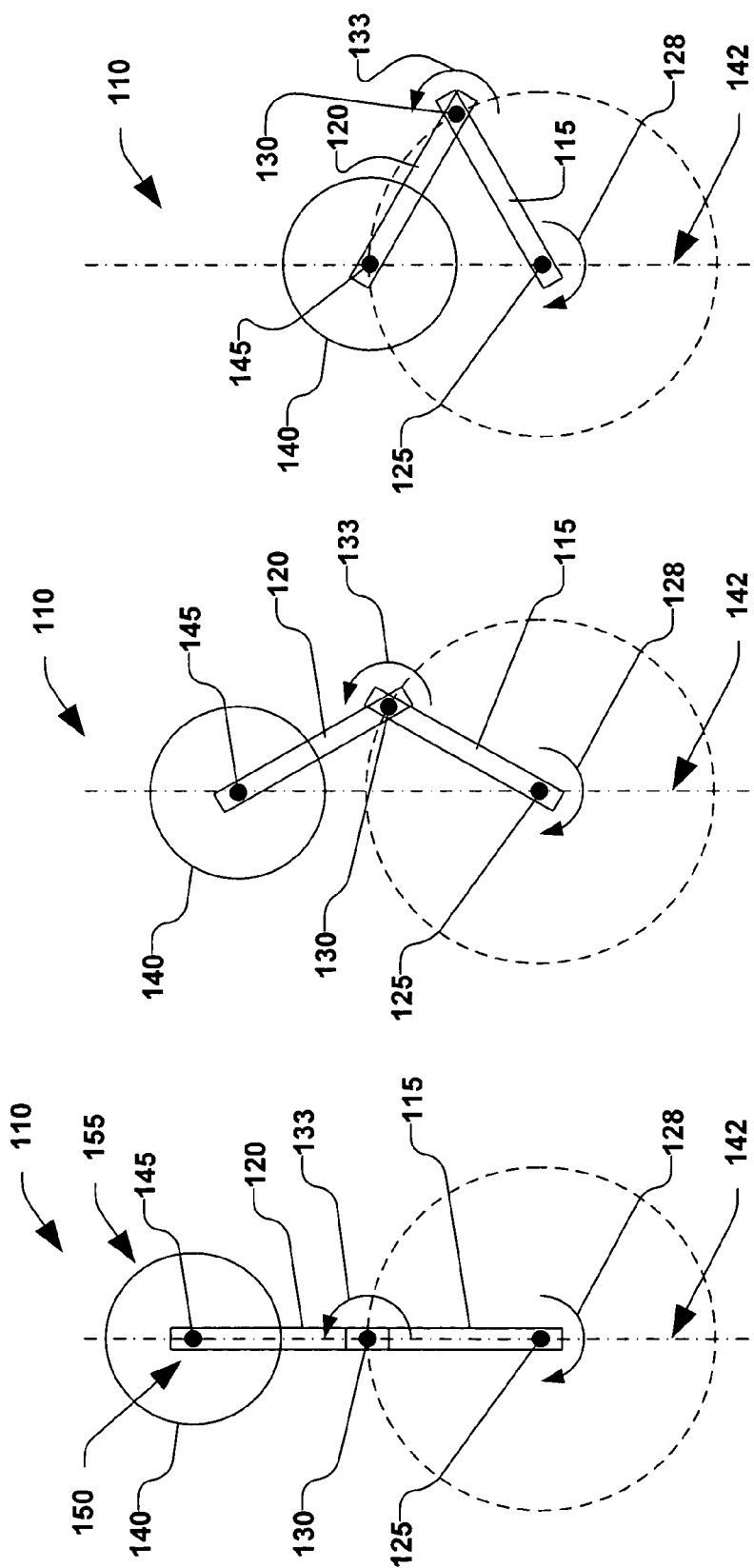

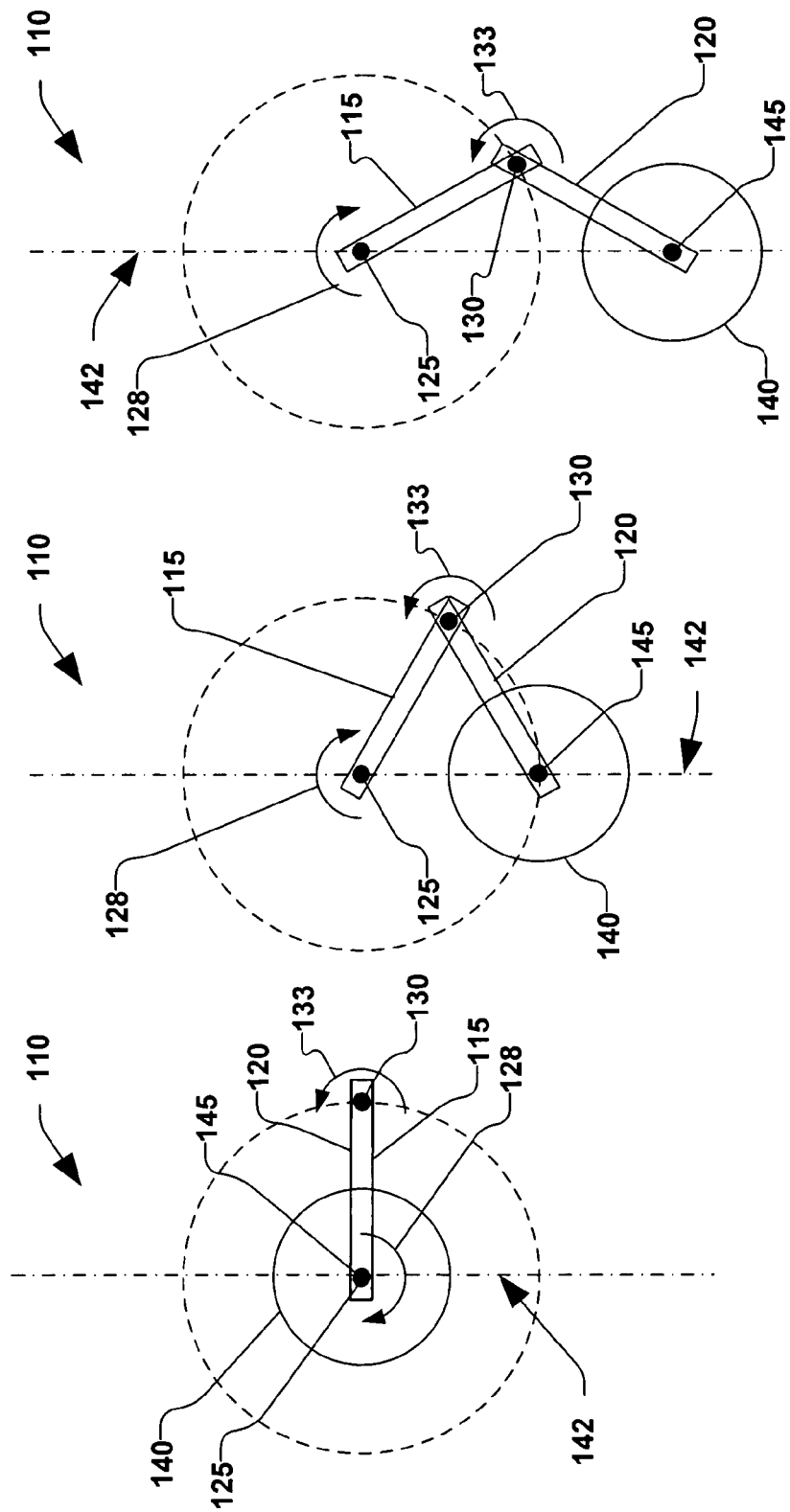

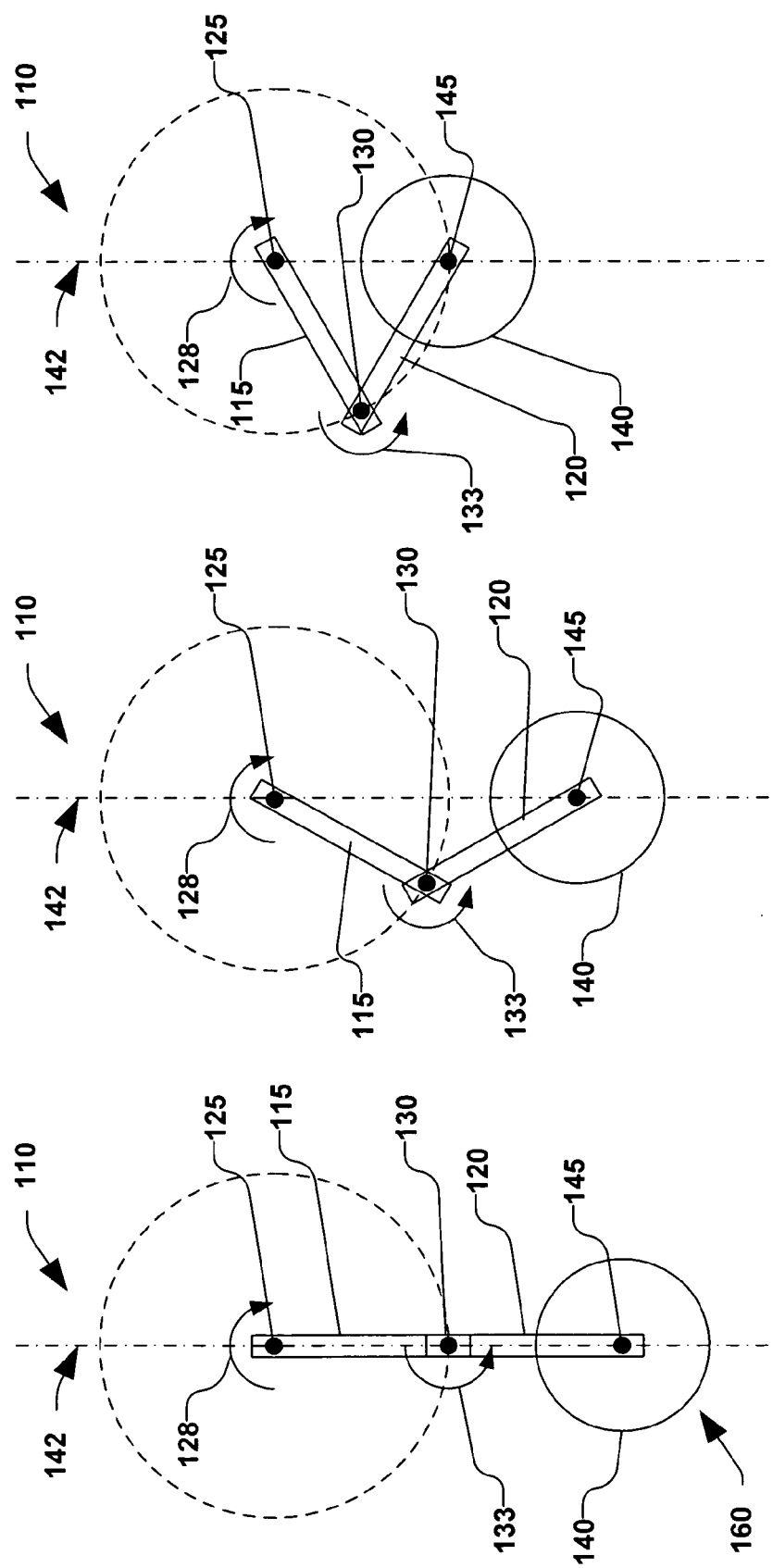

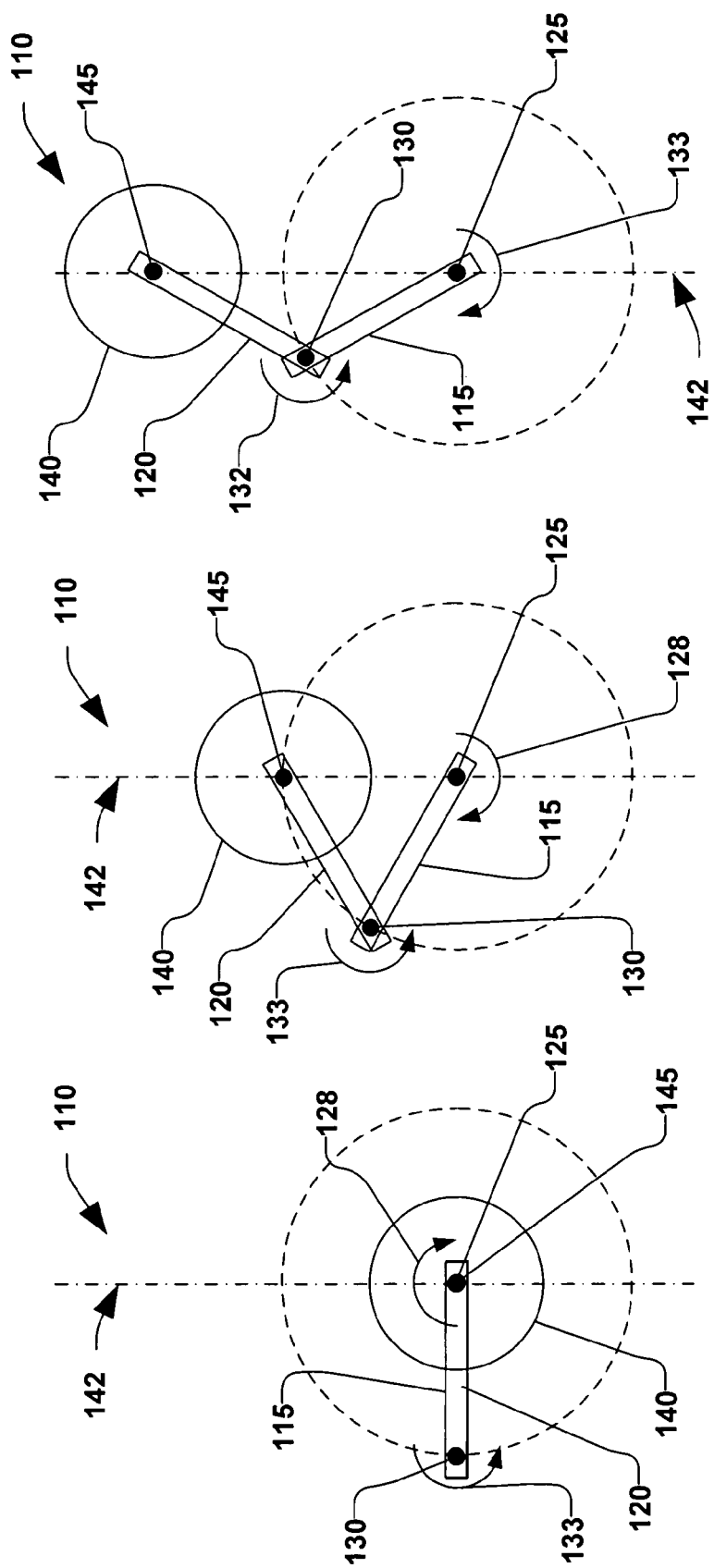

WAFER 2D SCAN MECHANISM

FIELD OF THE INVENTION

The present invention relates generally to semiconductor processing systems, and more specifically to an apparatus and method for controlling a quality and precision of motion of a substrate during ion implantation.

BACKGROUND OF THE INVENTION

In the semiconductor industry, various manufacturing processes are typically carried out on a substrate (e.g., a semiconductor wafer) in order to achieve various results on the substrate. Processes such as ion implantation, for example, can be performed in order to obtain a particular characteristic on or within the substrate, such as limiting a diffusivity of a dielectric layer on the substrate by implanting a specific type of ion. Conventionally, ion implantation processes are performed in either a batch process, wherein multiple substrates are processed simultaneously, or in a serial process, wherein a single substrate is individually processed. Traditional high-energy or high-current batch ion implanters, for example, are operable to achieve a short ion beam line, wherein a large number of wafers may be placed on a wheel or disk, and the wheel is simultaneously spun and radially translated through the ion beam, thus exposing all of the substrates surface area to the beam at various times throughout the process. Processing batches of substrates in such a manner, however, generally makes the ion implanter substantially large in size.

In a typical serial process, on the other hand, an ion beam is either scanned in a single axis across a stationary wafer, or the wafer is translated in one direction past a fan-shaped, or scanned ion beam. The process of scanning or shaping a uniform ion beam, however, generally requires a complex and/or long beam line, which is generally undesirable at low energies. Furthermore, a uniform translation and/or rotation of either the ion beam or the wafer is generally required in order to provide a uniform ion implantation across the wafer. However, such a uniform translation and/or rotation can be difficult to achieve, due, at least in part, to substantial inertial forces associated with moving the conventional devices and scan mechanisms during processing.

Therefore, a need exists for a device for scanning an ion beam across a substrate, wherein the substrate is uniformly translated and/or rotated with respect to the ion beam.

SUMMARY OF THE INVENTION

The present invention overcomes the limitations of the prior art. Consequently, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward a scanning mechanism for processing a substrate, wherein the scanning mechanism further comprises a two-link rotary subsystem. According to one exemplary aspect of the invention, a base portion is provided, wherein a first link is rotatably coupled to the base portion by a first joint, and wherein the first link is operable to rotate in a first rotational direction about a first axis associated with the first joint. A second link is further rotatably coupled to the first link by a second joint spaced a predetermined distance from the first joint, and wherein the second link is further operable to rotate in a second rotational direction about a second axis associated with the second joint. The second link further comprises an end effector, wherein the end effector is further spaced the predetermined distance from the second joint.

According to another exemplary aspect of the invention, a first actuator and a second actuator are provided, wherein the first and second actuators are operable to respectively rotate the first link and the second link about the respective first axis and second axis. The first actuator, for example, is operable to continuously rotate the first link in the first rotational direction, and the second actuator is operable to continuously rotate the second link in the second rotational direction. According to one exemplary aspect, the first rotational direction and the second rotational direction are opposite one another, wherein the end effector is operable to oscillate in a generally linear first scan path. According to another exemplary aspect, the end effector is further coupled to the second link via a third joint, wherein the end effector is operable to rotate and/or tilt with respect to the second link.

In accordance with another exemplary aspect of the invention, the first link and the second link are of approximately equal length, wherein a continuous oscillatory motion along the first scan path is generally permitted, and wherein the first and second joints rotate in a single respective direction.

In accordance with still another exemplary aspect of the invention, a generally constant velocity of the end effector can be maintained in a predetermined range of motion along the first scan path, wherein a rotational velocity of the respective first link and second link is controlled, and wherein the rotational velocities are maintained at non-zero values throughout the movement of the end effector.

According to yet another exemplary aspect, a translation mechanism is further provided, wherein the base portion and associated rotary subsystem is further operable to translate along a second scan path, generally referred to as a slow scan axis, wherein the second scan path is generally perpendicular to the first scan path.

According to another exemplary aspect of the invention, a scanning system is provided, wherein a controller is operable to control the respective rotational velocity of the first link and second link such that the movement of the substrate within the predetermined range is maintained at a substantially constant value. Also, a method for scanning a substrate is provided, wherein the method comprises rotating the first link and second link in a predetermined manner, wherein the substrate is translated within the predetermined range along the first scan path at a generally constant velocity. Furthermore, the method comprises maintaining the respective rotational velocity of the first link and second link such that the rotational velocities do not cross zero velocity.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIGS. 2A–2L are plan views of the exemplary scanning apparatus of FIG. 1 at various positions according to another aspect of the invention.

DETAILED DESCRIPTION OF THE INVENTION

Figure 1:
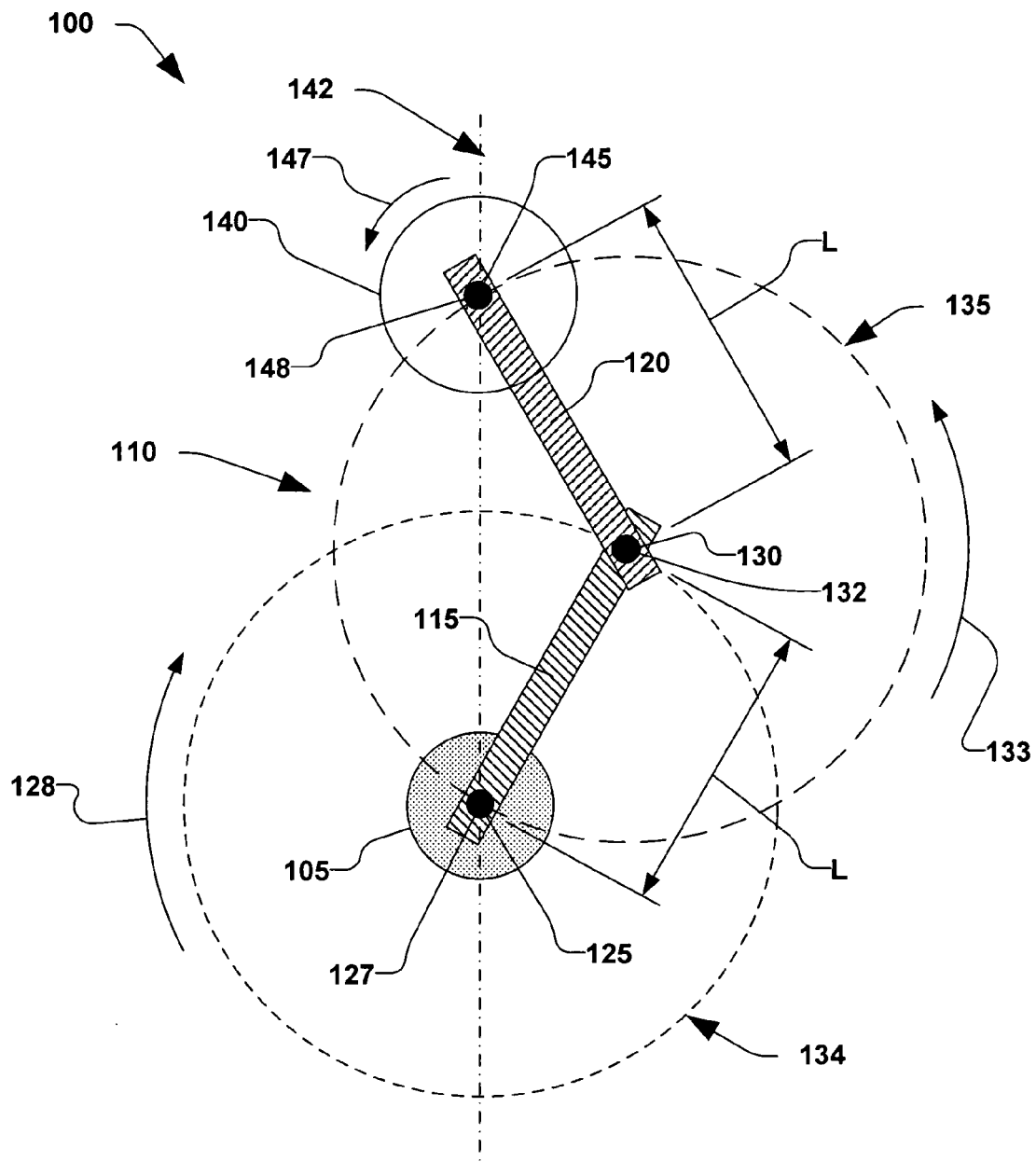
FIG. 1 is a plan view of an exemplary scanning apparatus according to one aspect of the present invention.

The present invention is directed generally towards a scanning mechanism for moving a substrate relative to a beam. More particularly, the scanning mechanism limits the amount of inertial force seen by the substrate, wherein a motion of the scanning mechanism oscillates via a two-link rotary subsystem. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Referring now to the figures, FIG. 1 illustrates an exemplary scanning mechanism 100 according to one exemplary aspect of the present invention. The scanning mechanism 100, for example, may be further associated with an ion beam (not shown) for use in an ion implantation process, as will be discussed hereafter. It should be noted that the present invention may be utilized in conjunction with various semiconductor processing systems, and all such systems are contemplated as falling within the scope of the present invention. The scanning mechanism 100, for example, comprises a base portion 105 operably coupled to a rotary subsystem 110. The base portion 105, for example, may be stationary with respect to the beam (not shown), or may be further operable to move with respect to the beam, as will be discussed hereafter. The rotary subsystem 110 comprises a first link 115 and a second link 120 associated therewith, wherein, for example, the rotary subsystem is operable to linearly translate a substrate (not shown) with respect to the base portion 105 via a predetermined movement of the first link and the second link.

According to one example, the first link 115 is rotatably coupled to the base portion 105 via a first joint 125, wherein the first link is operable to continuously rotate about a first axis 127 in a first rotational direction 128 (e.g., the first link is operable rotate clockwise or counter-clockwise with respect to the first joint). The second link 120 is further rotatably coupled to the first link 115 via a second joint 130, wherein the second joint is spaced a predetermined distance L from the first joint 125. The second link is further operable to continuously rotate about a second axis 132 in a second rotational direction 133 (e.g., the second link is operable to rotate clockwise or counter-clockwise with respect to the second joint). The first link 115 and the second link 120, for example, are further operable to rotate in separate, yet generally parallel first and second planes (not shown), respectively, wherein the first and second planes are generally perpendicular to the respective first and second axes 127 and 132. Furthermore, the first link 115 and second link 120 are operable to continuously rotate 360° in a respective first rotational path 134 and second rotational path 135 about the respective first joint 125 and second joint 130.

According to one exemplary aspect of the invention, the first rotational direction 128 is generally opposite the second rotational direction 133, wherein an end effector 140 associated with the second link 120 is operable to linearly translate along a first scan path 142 associated with the predetermined movement of the first link 115 and the second link. The end effector 140, for example, is operably coupled to the second link 120 via a third joint 145 associated with the second link, wherein the third joint is spaced the predetermined distance L from the second joint 130. The third joint 145, for example, is operable to provide a rotation 147 of the end effector 140 about a third axis 148. Furthermore, according to another example, the third joint 145 is further operable to provide a tilt (not shown) of the end effector 140, wherein, in one example, the end effector is operable to tilt about one or more axes (not shown) which are generally parallel to the second plane (not shown).

The end effector 140, for example, is further operable to secure the substrate (not shown) thereto, wherein the movement of the end effector generally defines a movement of the substrate. The end effector 140, for example, may comprise an electrostatic chuck (ESC), wherein the ESC is operable to substantially clamp or maintain a position of the substrate with respect to the end effector. It should be noted that while an ESC is described as one example of the end effector 140, the end effector may comprise various other devices for maintaining a grip of a payload (e.g., the substrate), and all such devices are contemplated as falling within the scope of the present invention.

The predetermined movement of the first link 115 and second link 120, for example, can be further controlled in order to linearly oscillate the end effector 140 along the first scan path 142, wherein the substrate (not shown) can be moved in a predetermined manner with respect to the ion beam (e.g., an ion beam coincident with the first axis 127). A rotation of the third joint 145, for example, can be further controlled, wherein the end effector 140 is maintained in a generally constant rotational relation with the first scan path 142. It should be noted that the predetermined distance L separating the first joint 125 and second joint 130, as well as the second joint and third joint 145, provides a general congruity in link length when measured between the respective joints. Such a congruity in length of the first link 115 and second link 120, for example, generally provides various kinematic advantages, such as those which will be described hereafter.

FIGS. 2A–2L illustrate the rotary subsystem 110 in various progressive positions according to another exemplary aspect of the present invention, wherein the first rotational direction 128 and the second rotational direction 133 generally remain constant, and do not reverse throughout the predetermined movement of the first link 115 and second link 120. For example, in FIG. 2A, the end effector 140 is at a first position 150 along the first scan path 142, wherein the third joint 145 is spaced a distance of approximately twice the predetermined distance L from the first joint 125, thus defining a maximum position 155 of the end effector. Upon a rotation of the first link 115 and second link 120 about the respective first and second joints 125 and 130 in the respective first rotational direction 128 and second rotational direction 133, as illustrated in FIGS. 2B–2L, the end effector 140 can be moved along the first scan path 142 in a generally straight-line manner. In FIG. 2G, for example, the end effector 140 is at another maximum position 160 along the first scan path 142, wherein the third joint 145 is again spaced a distance of approximately twice the predetermined distance L from the first joint 125. In FIG. 2H, for example, it should be noted that the end effector 140 is moving back toward the first position 150, while the first rotational direction 128 and second rotational direction 133 remain unchanged. Following the position illustrated in FIG. 2L, the rotary subsystem 110 is operable to move again to the first position 150 of FIG. 2A, while still maintaining the constant rotational directions 128 and 133, wherein the linear oscillation can be continued.

Figure 3:
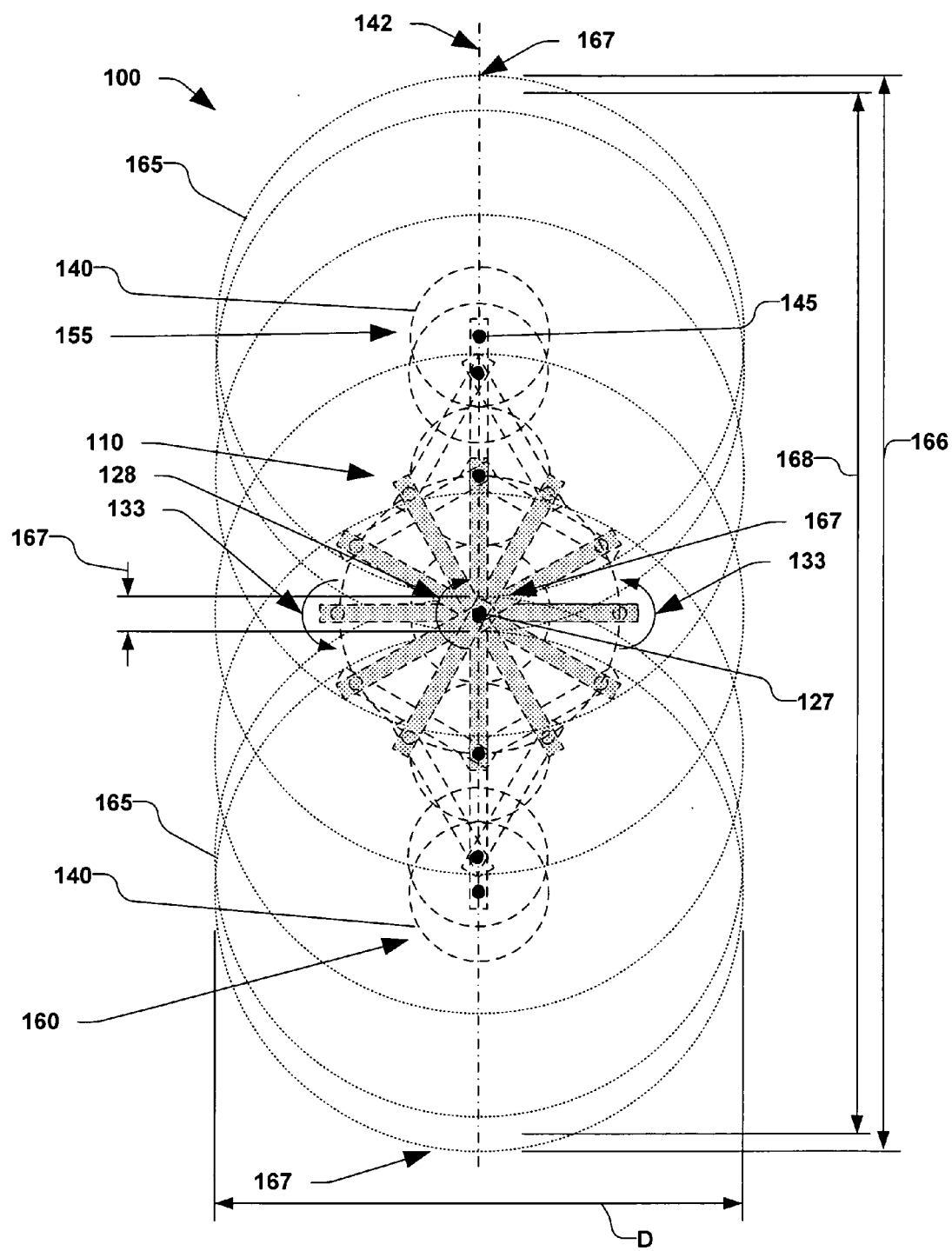
FIG. 3 is a plan view of the scanning apparatus illustrating a predetermined range of motion of the scanning apparatus according to one exemplary aspect of the invention.

Maintaining constant rotational directions 128 and 133 of the respective first link 115 and second link 120 can provide various mechanical and kinematic advantages associated with moving the end effector 140 along the generally straight first scan path 142. For example, during the oscillation of the end effector 140, a substantially constant velocity of the end effector 140 is generally desirable within a predetermined range of motion thereof. FIG. 3 illustrates the rotary subsystem 110 in the various positions of FIGS. 2A–2L, wherein a substrate 165 (illustrated in phantom) further resides on the end effector 140. It should be noted that the rotary subsystem 110 is not drawn to scale, and that the end effector 140 is illustrated as substantially smaller than the substrate for clarity purposes. An exemplary end effector 140 can be approximately the size of the substrate 165, wherein adequate support for the substrate can be provided. It shall be understood, however, that the end effector 140 and other features illustrated can be of various shapes and sizes, and all such shapes and sizes are contemplated as falling within the scope of the present invention.

As illustrated in FIG. 3, the scanning mechanism 100 is operable to linearly oscillate the substrate 165 along the first scan path 142 between maximum positions 155 and 160 of the end effector 140. Therefore, a maximum scan distance 166 traveled by opposite ends 167 of the substrate 165 can be generally defined along the scan path 142 (e.g., opposite ends of the circumference of the substrate along the first scan path), wherein the maximum scan distance is associated with the maximum positions 155 and 160 of the end effector 140. According to one exemplary aspect of the invention, the maximum scan distance 166 is greater than twice a diameter D of the substrate 165. The amount by which the maximum scan distance 166 is greater than twice the diameter D is defined as an overshoot 167. The overshoot 167, for example, can be advantageously utilized when the oscillation of the substrate 165 along the first scan path 142 changes directions, such as between the position illustrated in FIG. 2G which is between the positions of FIGS. 2F and 2H.

It should be therefore noted that while the rotational directions 128 and 133 remain constant (i.e., unchanged), the movement of the end effector 140 and substrate 165 oscillates along the first scan path 142, thus changing direction at the maximum positions 155 and 160. Such a change in direction of the end effector 140 (and hence, the substrate 165) is associated with a change in velocity and acceleration of the end effector and substrate. In ion implantation processes, for example, it is generally desirable for the end effector 140 to maintain a substantially constant velocity along the scan path 142 when the substrate 165 passes through an ion beam (not shown), such as an ion beam which is generally coincident with the first axis 127. Such a constant velocity provides for the substrate 165 to be generally evenly exposed to the ion beam throughout the movement through the ion beam. However, due to the oscillatory motion of the end effector 140, acceleration and deceleration of the end effector is inevitable; such as when the third joint 145 (e.g., associated with the end effector and substrate 165) approaches the maximum positions 155 and 160 at either extent of the linear oscillation. Such an acceleration and deceleration near the maximum positions 155 and 160 (e.g., during scan path turn-around), should be maintained at reasonable levels in order to minimize inertial forces and associated reaction forces transmitted to the base portion 105 of the scanning mechanism 100. Variations in velocity of the end effector 140 during exposure of the substrate 165 to the ion beam, for example, can lead to a non-uniform ion implantation across the substrate.

Therefore, a generally constant velocity is desired for a predetermined range 168 associated with the movement of the substrate 165 through the ion beam. For example, the predetermined range 168 is associated with the physical dimensions of the substrate 165 (e.g., twice a diameter of the substrate), such that the acceleration and deceleration of the end effector can be generally accommodated within the overshoot 167. Accordingly, once the substrate 165 completely passes through the ion beam, the acceleration and deceleration of the end effector 140 will not substantially affect an ion implantation process or dose uniformity across the substrate.

Figure 4:
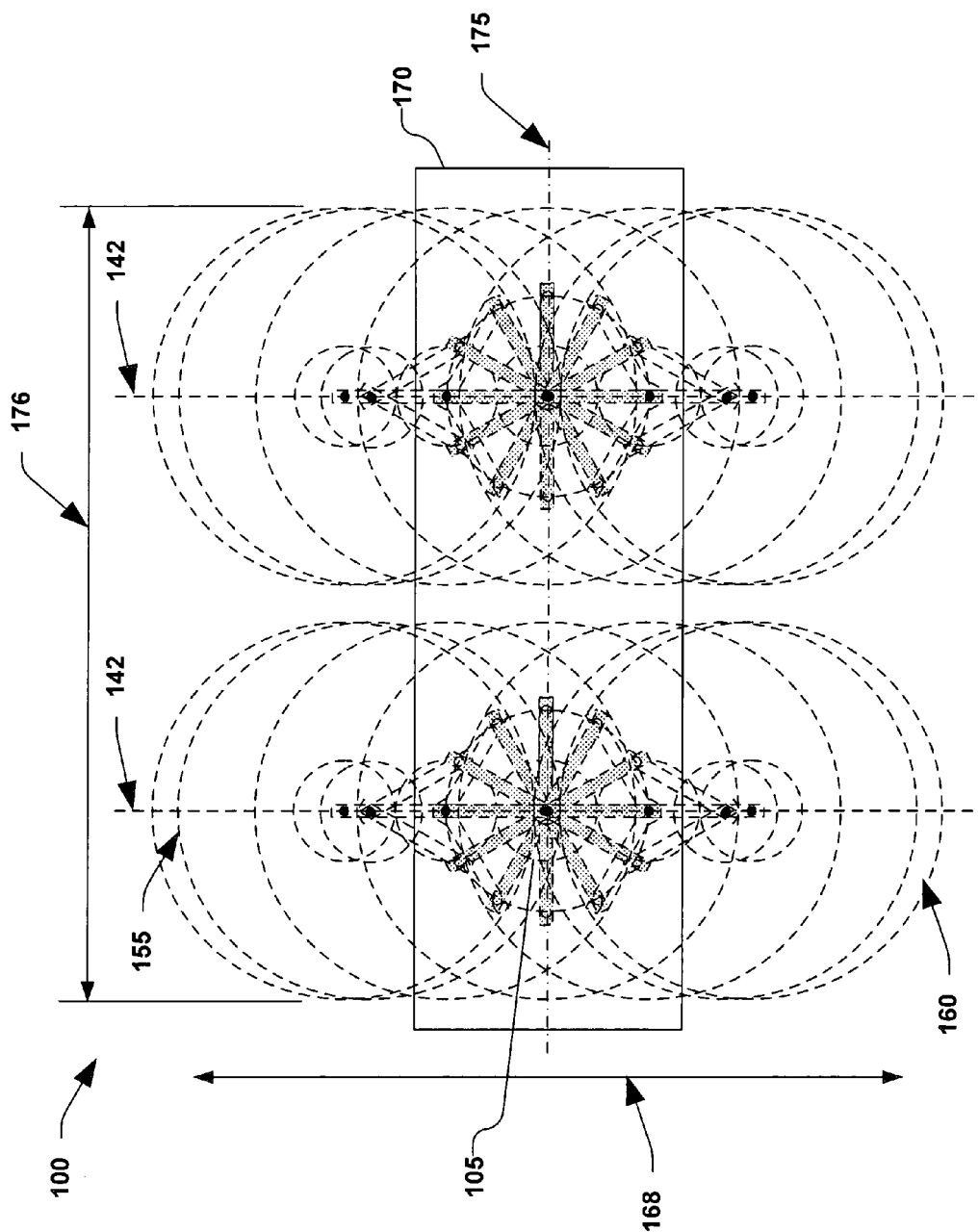
FIG. 4 is a plan view of the scanning apparatus illustrating another range of motion of the scanning apparatus according to another exemplary aspect of the invention.

FIG. 4 illustrates another exemplary aspect of the present invention, wherein the base portion 105 of the scanning mechanism 100 is further operable to translate in one or more directions. For example, the base portion 105 is operably coupled to a translation mechanism 170, wherein the translation mechanism is operable to translate the base portion and rotary subsystem along a second scan path 175, wherein the second scan path is substantially perpendicular to the first scan path 142. According to one exemplary aspect of the invention, the first scan path 142 is associated with a fast scan of the substrate 165, and the second scan path 175 is associated a slow scan of the substrate, wherein the substrate is indexed one increment along the second scan path for every translation of the substrate between maximum positions 155 and 160 along the first scan path. Therefore, for a full oscillation of the substrate 165 along the first scan path 142 (e.g., as illustrated in FIGS. 2A–2L), the translation mechanism 170 will translate the substrate two increments along the second scan path 175. A total translation 176 of the base portion, for example, is approximately the diameter D of the substrate 165. The translation mechanism 170 of FIG. 4, for example, may further comprise a prismatic joint. The translation mechanism 170 may still further comprise a ball screw system (not shown), wherein the base portion 105 can be smoothly translated along the second scan path 175. Such a translation mechanism 170, for example, is operable to "paint" the substrate 165 residing on the end effector 140 by passing the substrate through the ion beam in an incremental manner during the oscillation of the end effector, thus uniformly implanting ions across the entire substrate.

Figure 5:
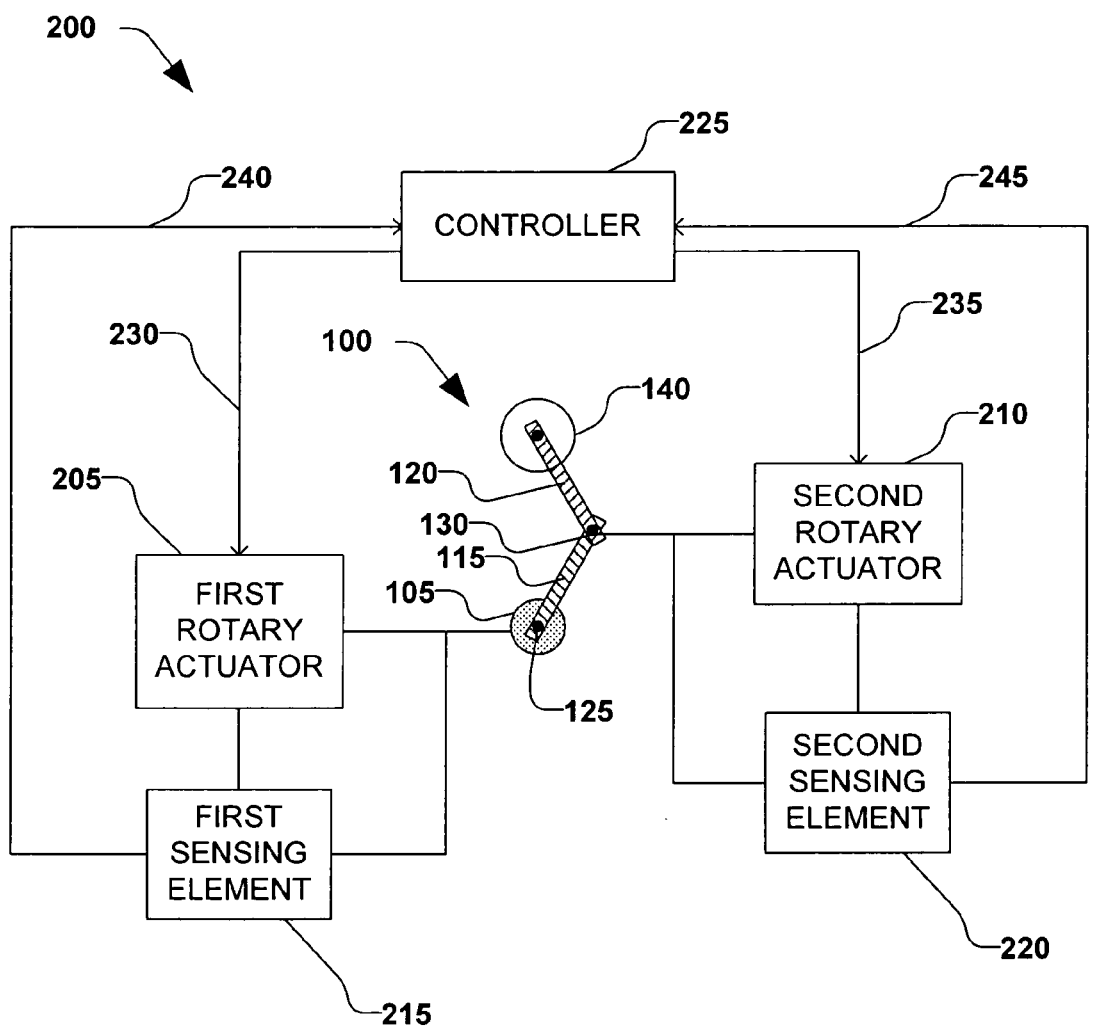
FIG. 5 is a system-level block diagram of an exemplary scanning system according to another aspect of the present invention.

FIG. 5 illustrates another exemplary aspect of the present invention in block diagram form, wherein a scanning system 200 comprises the scanning mechanism 100 of FIG. 1. In FIG. 5, for example, a first rotary actuator 205 is associated with the first joint 125 and a second rotary actuator 210 is associated with the second joint 130 wherein the first actuator and second actuator are operable to provide a rotational force to the first and second links 115 and 120, respectively. For example, the first and second rotary actuators 205 and 210 comprise one or more servo motors or other rotational devices operable to rotate the respective first link 115 and second link 120 in the first rotational direction 128 and the second rotational direction 133 of FIG. 1, respectively.

The scanning system 200 of FIG. 5, for example, further comprises a first sensing element 215 and a second sensing element 220 associated with the respective first and second actuators 205 and 210, wherein the first and second sensing elements are further operable to sense position, or other kinematic parameters, such as velocity or acceleration, of the respective first and second links 115 and 120. Furthermore, according to another exemplary aspect of the invention, a controller 225 (e.g., a multi-axes motion controller) is operably coupled to drivers and/or amplifiers (not shown) of the first and second rotary actuators 205 and 210 and the first and second sensing elements 215 and 220, wherein the controller 225 is operable to control an amount of power 230 and 235 (e.g., a drive signal) provided to the respective first and second rotary actuators for an associated control duty cycle (e.g., a movement of the end effector 140 between maximum positions 155 and 160 illustrated in FIG. 4). The first and second sensing elements 215 and 200 of FIG. 5, such as encoders or resolvers, are further operable to provide respective feedback signals 240 and 245 to the controller 225, wherein the drive signals 230 and 235 to the respective actuators 205 and 210, for example, are calculated in real-time. Such real-time calculations of the drive signals 230 and 235 generally permits a precise adjustment of the power delivered to each respective rotary actuator 205 and 210 at predetermined time increments.

The general scheme of motion control of the present invention generally provides a smoothness of motion of the end effector 140, and can minimize velocity errors associated therewith. According to another example, the controller 225 further comprises an inverse kinematic model (not shown), wherein the articulated motion of the end effector 140 is derived for each joint 125 and 130 at each duty cycle. The controller 225, for example, is further operable to control each actuator 205 and 210 by calculating a feed forward, model-based complimentary torque for each respective joint 125 and 130 during each control duty cycle.

As discussed in the above example, the amount of power 230 and 235 provided to the respective first and second rotary actuators 205 and 210 is based, at least in part, on the positions sensed by the respective first and second sensing elements 215 and 220. Accordingly, the position of the end effector 140 of the scanning mechanism 100 can be controlled by controlling the amount of power provided to the first and second actuators 205 and 210, wherein the amount of power is further associated with a velocity and acceleration of the end effector along the first scan path 142 of FIG. 1. The controller 225 of FIG. 5, for example, is further operable to control the translation mechanism 170 of FIG. 4, wherein the movement of the base portion 105 along the second scan path 175 can be further controlled. According to one example, an incremental motion (e.g., a "slow scan" motion) of the translation mechanism 170 is synchronized with the motion of the end effector along the first scan path 142 (e.g., a "fast scan" motion), such that the translation mechanism is incrementally moved after each pass of the substrate 165 through the ion beam (e.g, during a change of direction of the wafer along the fast scan path).

Figure 6A:
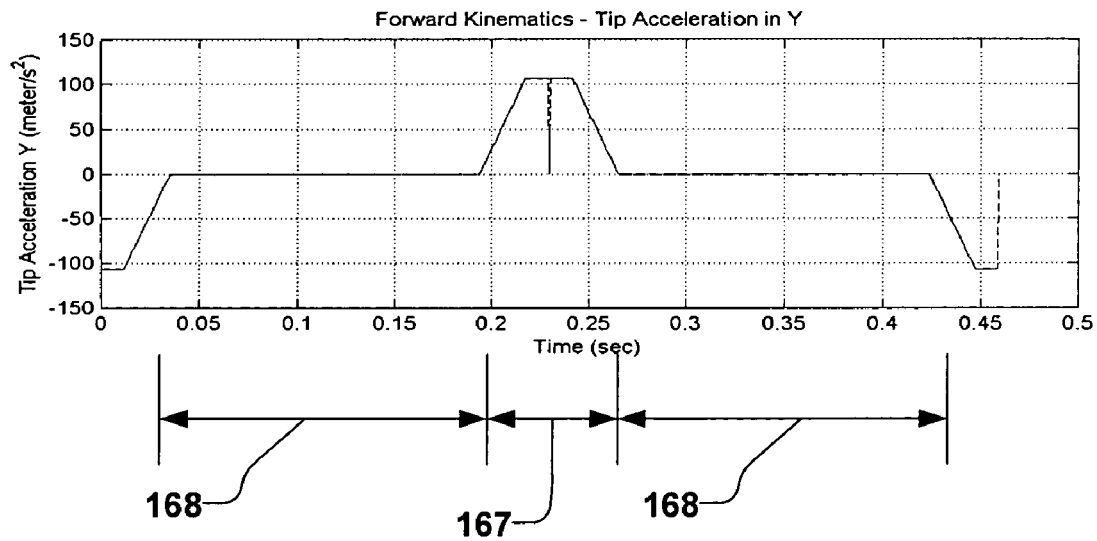
FIGS. 6A–6C are forward kinematic graphs of acceleration, velocity, and position of a substrate associated with the scanning apparatus according to one exemplary aspect of the invention.
Figure 6B:
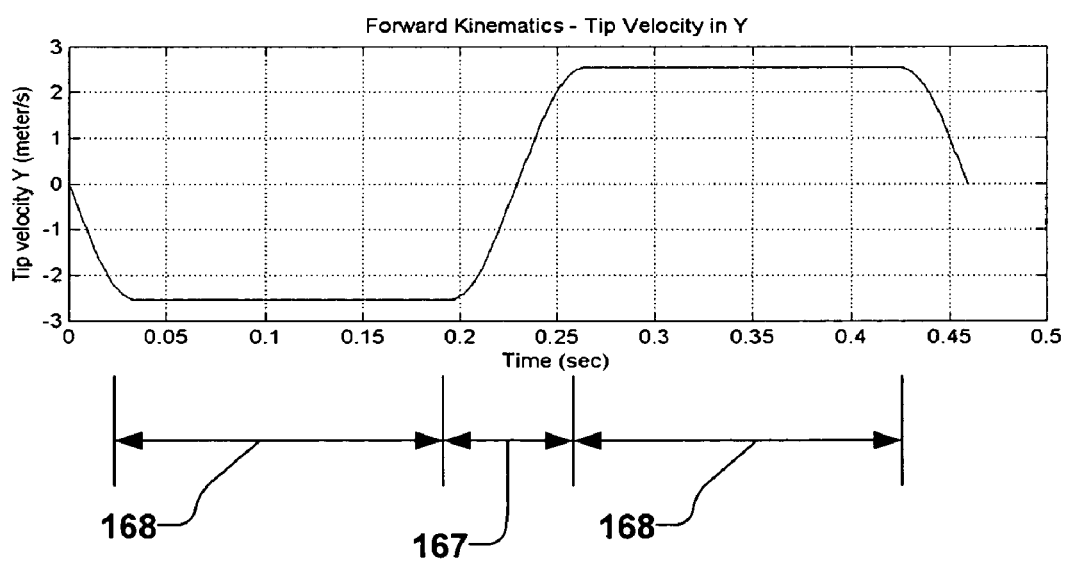
Figure 6C:
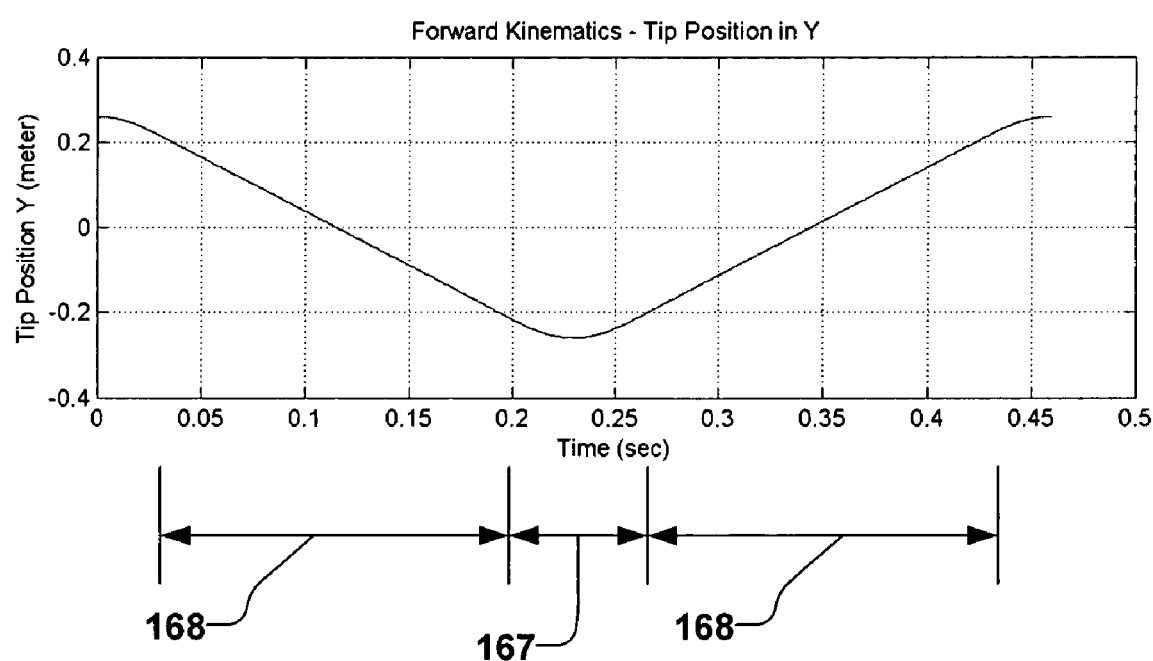

According to another exemplary aspect of the present invention, a rotational velocity profile and acceleration profile of the first and second links 115 and 120 of FIG. 3 is predetermined, wherein inertial forces associated with the velocity and acceleration are minimized within the predetermined range 168. For example, the maximum scan distance 166 generally defines a workspace of the rotary sub-system 110 with respect to ion beam utilization, wherein the first and second links 115 and 120 are at full extension at the start of the oscillation (e.g., the first position 150 of FIG. 2A). Advanced trajectory and path planning techniques may be used to design motion profiles in operational space, as well as in joint space, wherein large inertial forces associated with joint accelerations are substantially minimized. These techniques, in turn, can reduce size and power requirements associated with the joint actuators 205 and 210 of FIG. 5. For example, FIGS. 6A, 6B, and 6C illustrate exemplary forward kinematic graphs showing respective acceleration, velocity, and position of the end effector 140 of FIG. 3 at various times. Time, in this instance, is associated with end effector position along the first scan path 142, wherein a constant velocity is desirable within the predetermined range 168. During periods of changing velocity (and hence an acceleration or deceleration of the end effector 140), it is desirable that the substrate be in the region of overshoot 167.

Figure 7A:
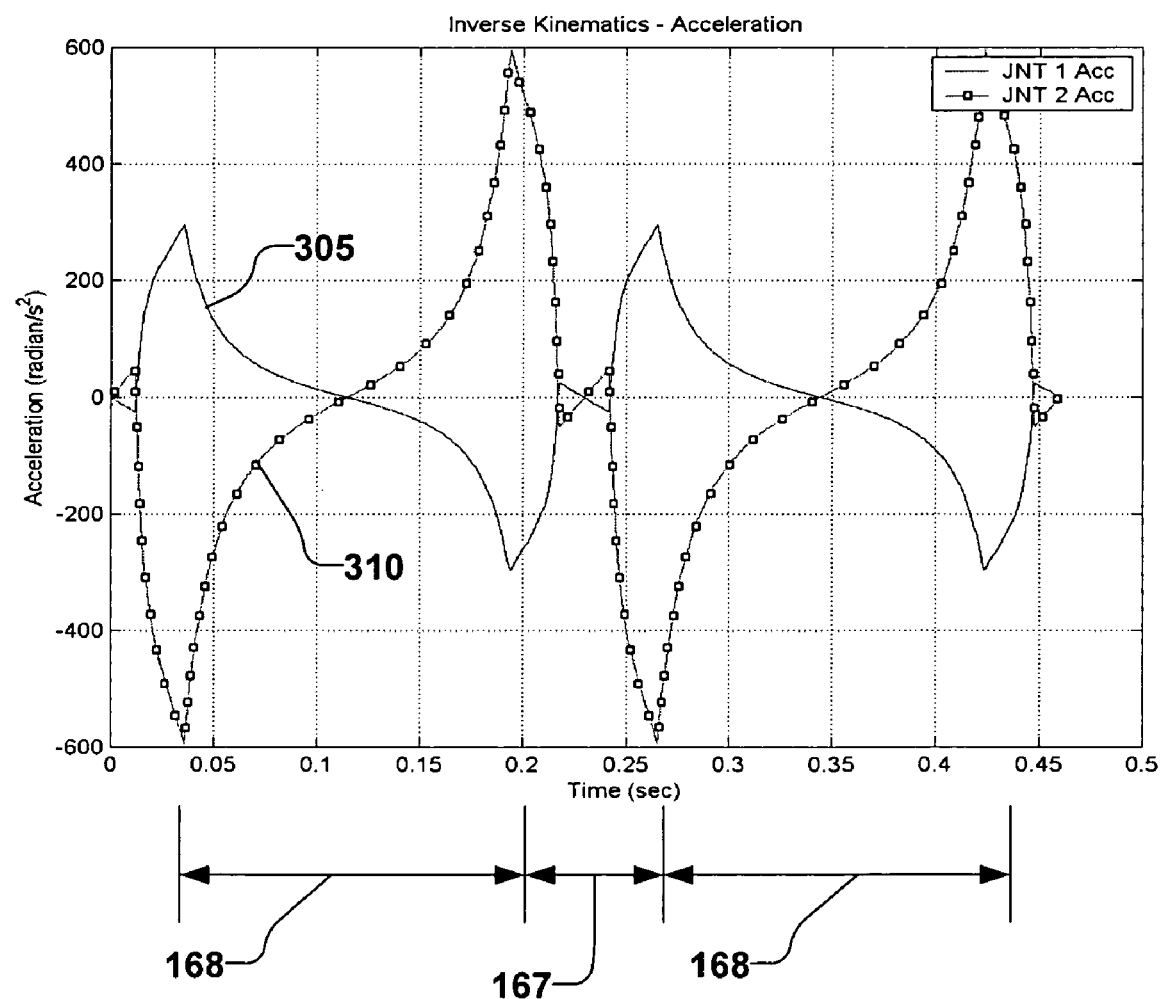
FIGS. 7A–7C are reverse kinematic graphs of acceleration, velocity, and position of the substrate associated with the scanning apparatus according to another exemplary aspect of the invention.
Figure 7B:
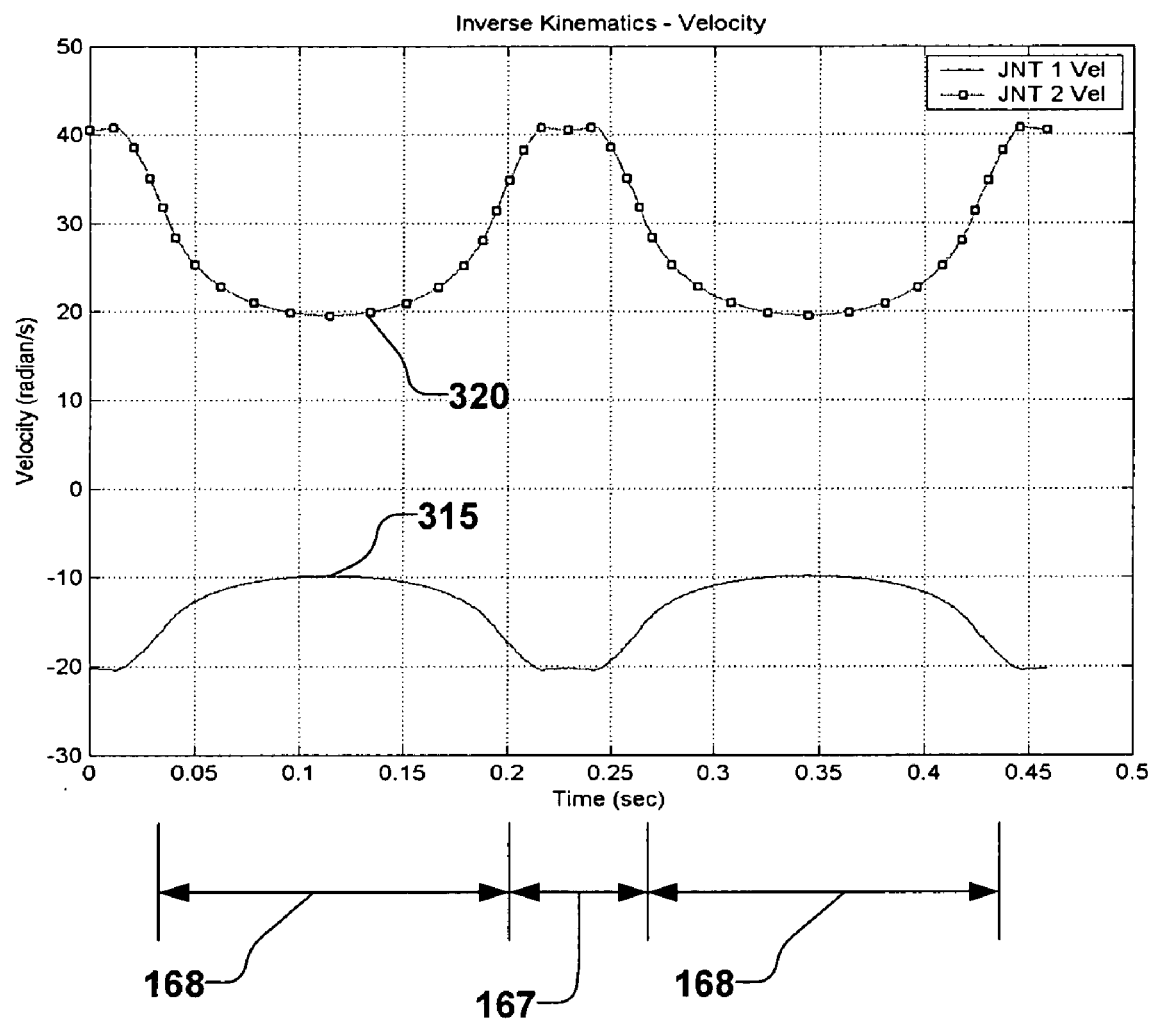
Figure 7C:
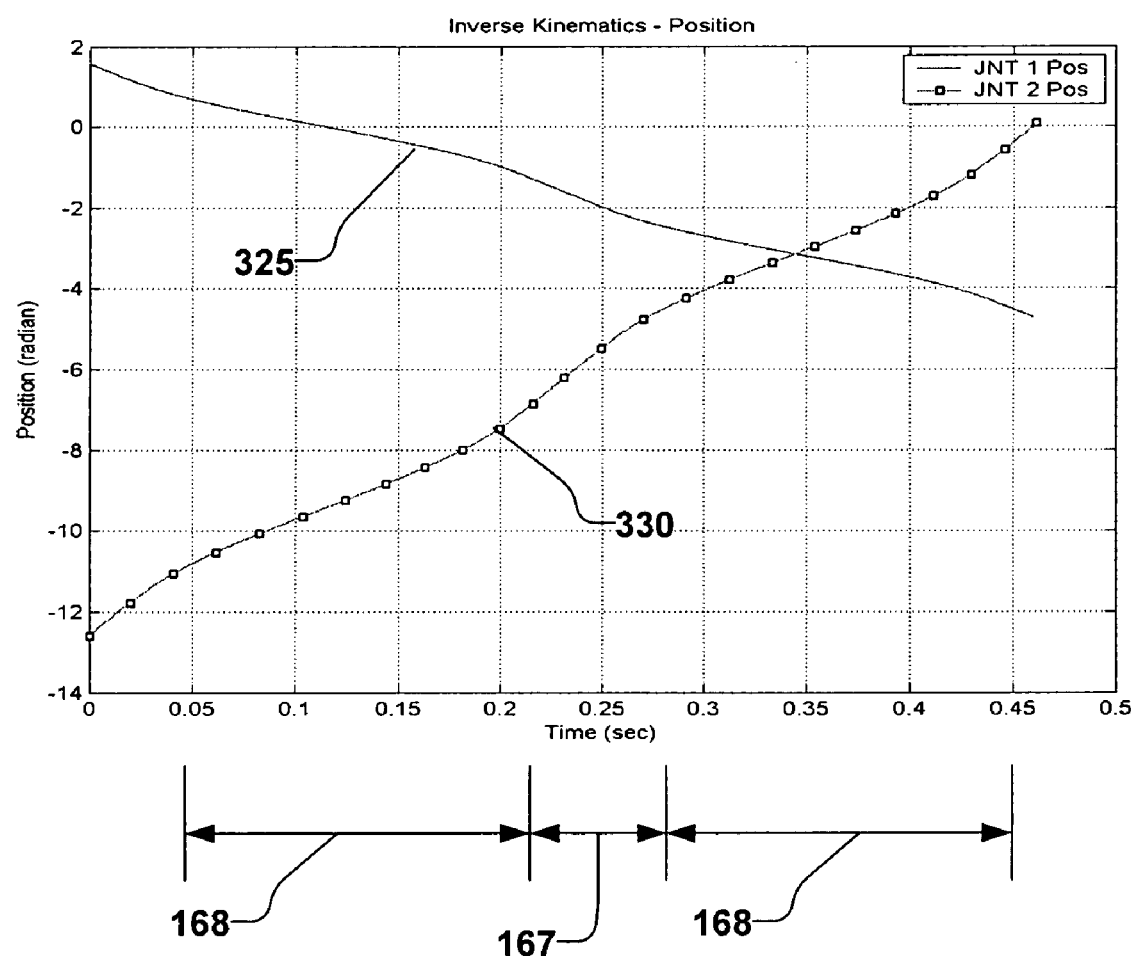
Figure 8:
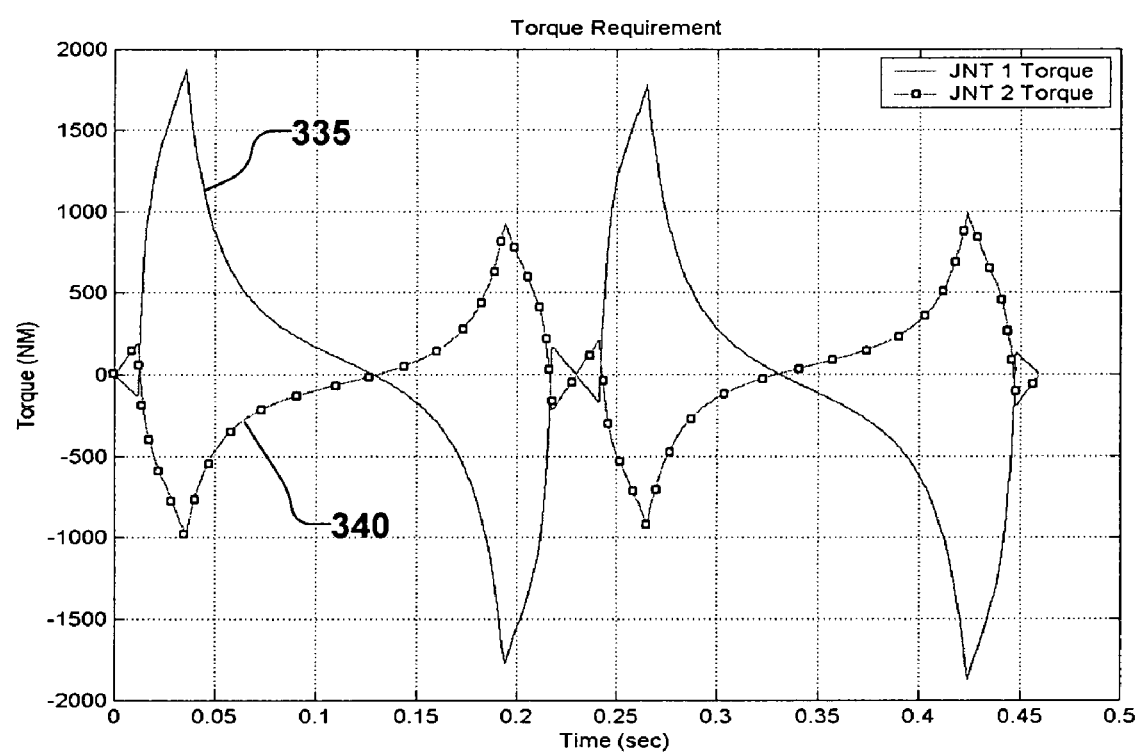
FIG. 8 is a reverse kinematic graph of torque associated with the scanning apparatus according to another exemplary aspect of the invention.

According to another exemplary aspect of the invention, proper inverse kinematics techniques can be utilized to overcome singularities when the first and second links 115 and 120 of FIG. 3 are at or close to full extension at the maximums 155 and 160, or when they are folded upon one another (e.g., FIGS. 2A and 2G illustrate full extension, and FIGS. 2D and 2J illustrate the first link 115 and second link 120 folded upon one another). Model-based, predictive control architectures, for example, may be utilized to provide a substantially smooth motion of the substrate 165 along the first scan path 142. As illustrated in FIGS. 7A. 7B, and 7C, inverse kinematics can be utilized to define a respective rotational acceleration profile 305 and 310, velocity profile 315 and 320, and position profile 325 and 330 of the respective first joint 125 and second joint 130 of FIG. 3 in order to provide a generally uniform velocity of the substrate 165 within the predetermined range 168. It should be noted that the present invention advantageously maintains the rotational velocity of the first and second joints 125 and 130 such that neither joint rotational velocity crosses zero throughout the full 360° rotation of the first and second links 115 and 120, as illustrated in FIG. 7B. Maintaining the rotational velocities (and hence, the respective rotational directions) such that they do not cross zero velocity generally minimizes large inertial forces associated with acceleration and deceleration of the joints. Therefore, a great advantage is provided over the prior art, in that the first and second actuators continuously rotate in the same rotational direction. FIG. 8 further illustrates exemplary torque profiles 335 and 340 for the respective first joint 125 and second joint 130 of FIG. 3 using inverse kinematics. It should be further noted that the torque associated with the first joint 125 and second joint 130 is significantly reduced in accordance with the present invention, as compared with conventional wafer scan mechanisms.

Figure 9:
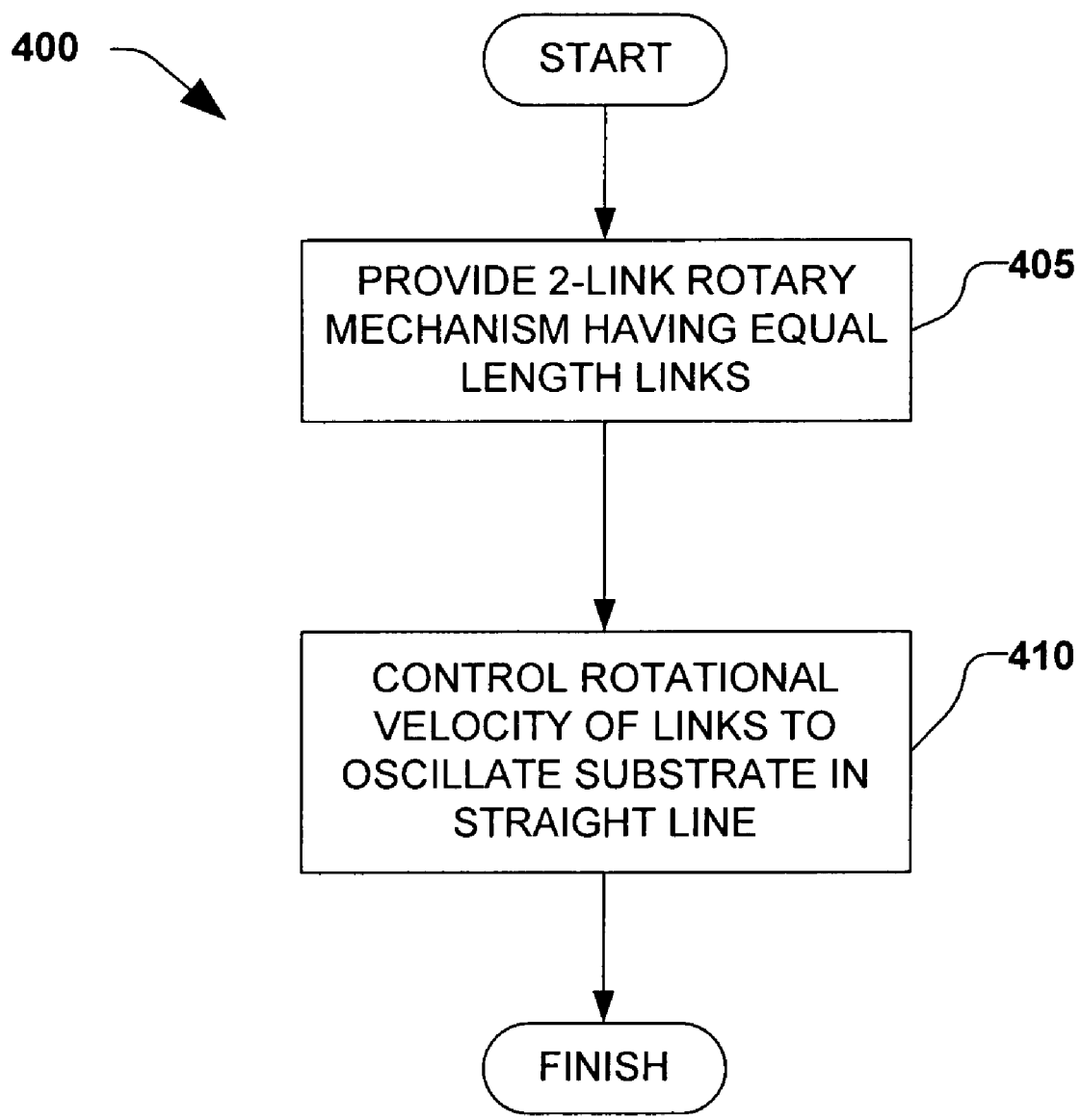
FIG. 9 is a block diagram of a method for processing a substrate according to another exemplary aspect of the invention.

According to still another exemplary aspect of the present invention, FIG. 9 is a schematic block diagram of an exemplary method 400 illustrating the integration and operation of the exemplary scanning mechanism of FIG. 1. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 9, the method 400 begins with providing a two-link rotary mechanism in act 405, wherein a distance between the joints is approximately equal. A rotational velocity of the links is controlled in act 410, wherein the end effector oscillates between two maximum positions, and wherein the velocity of the end effector is maintained generally constant within a predetermined range. Within the predetermined range, for example, an ion beam impinges upon the substrate, wherein the substrate is substantially uniformly exposed to the ion beam throughout the motion of the substrate. A predetermined control scheme may be utilized, such that non-linear inertial, coriolis and/or centripetal forces induced by links on joint actuators are compensated.

The scanning mechanism 100 (e.g., an articulated arm) of the present invention provides sufficient dexterity such that the scanning mechanism can further easily participate in material handling tasks. Such material handling tasks, for example, may comprise placing or transferring processed wafers to another transfer mechanism. Conversely, loading or picking of un-processed wafers can further be accomplished by mating with another transfer device.

In accordance with another exemplary aspect of the present invention, the scanning mechanism 100 can be further utilized in a process chamber (not shown) that is in state of high vacuum, wherein no mechanical components such as lubricated bearings or actuators are directly exposed to the environment. In order to achieve such ends, the joints of the mechanism 100, for example, are further provided with vacuum seals, such as Ferro-fluidic seals. It should be understood that any type of movable vacuum seal that provides an integrity of cleanliness of the process is contemplated as falling within the scope of the present invention. Therefore, the present invention is further operable to provide a motion generation and wafer scanning in a clean, vacuum environment.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A scanning apparatus for processing a substrate, the scanning apparatus comprising:
   a base portion; and
   a rotary subsystem comprising:
      a first link comprising a first joint, wherein the first link is rotatably coupled to the base portion by the first joint;
      a second link comprising a second joint, wherein the second link is rotatably coupled to the first link by the second joint, and wherein the first joint and the second joint are spaced a predetermined distance from one another, the second link further comprising an end effector whereon the substrate resides, wherein the end effector is operably coupled to the second link, and wherein the end effector is further spaced from the second joint by the predetermined distance;
      a first actuator operable to continuously rotate the first link about the first joint in a first rotational direction; and
      a second actuator operable to continuously rotate the second link about the second joint in a second rotational direction, wherein the second actuator comprises a servo motor fixedly mounted to the first link, and wherein the end effector is operable to linearly oscillate with respect to the base portion along a first scan path upon the rotation of the first and second actuators.

2. The scanning apparatus of claim 1, wherein the first rotational direction is opposite the second rotational direction.

3. The scanning apparatus of claim 1, wherein the base portion is operably coupled to a translation mechanism, wherein the translation mechanism is operable to move the base portion in one or more directions with respect to the translation mechanism.

4. The scanning apparatus of claim 3, wherein the translation mechanism is operable to move the base portion along a second scan path, wherein the second scan path is generally perpendicular to the first scan path.

5. The scanning apparatus of claim 3, wherein the translation mechanism comprises a linear drive system, wherein the linear drive system is operable to linearly translate the rotary subsystem in a direction generally perpendicular to the linear oscillation of the end effector.

6. The scanning apparatus of claim 1, wherein the end effector is operably coupled to the second link by a third joint, wherein the end effector is further operable to move in one or more directions with respect to the second link.

7. The scanning apparatus of claim 6, wherein the third joint provides the end effector with two or more degrees of freedom.

8. The scanning apparatus of claim 7, wherein the third joint is operable to provide a rotation and a tilt of the end effector with respect to the second link.

9. The scanning apparatus of claim 1, wherein the end effector comprises an electrostatic chuck.

10. The scanning apparatus of claim 1, wherein the first actuator comprises a servo motor fixedly mounted to the base portion.

11. The scanning apparatus of claim 1, wherein the first rotational velocity of the first actuator is operable to vary with respect to a location of the end effector.

12. The scanning apparatus of claim 1, wherein the second rotational velocity of the second actuator is operable to vary with respect to a location of the end effector.

13. The scanning apparatus of claim 1, wherein the base portion further comprises a prismatic joint, wherein the base portion is operable to move the rotary subsystem in one or more directions.

14. The scanning apparatus of claim 1, wherein the first link and the second link are generally parallel to a single plane.

15. The scanning apparatus of claim 14, wherein the end effector is further operable to rotate parallel to the single plane.

16. The scanning apparatus of claim 1, further comprising a controller operable to control a rotational velocity of the respective first and second links by controlling an amount of power provided to the respective first and second actuators.

17. The scanning apparatus of claim 16, further comprising one or more sensing elements associated with the first and second actuators, wherein the one or more sensing elements are operable to sense the rotational velocity of the respective first and second links and feed back the sensed rotational velocities to the controller.

18. The scanning apparatus of claim 17, wherein the one or more sensing elements comprise one or more encoders.

19. The scanning apparatus of claim 16, wherein the controller is operable to maintain the respective rotational velocities such that the linear oscillation of the end effector is generally constant within a predetermined scanning range of the end effector.

20. The scanning apparatus of claim 19, wherein the predetermined range of motion of the end effector is at least twice a diameter of the substrate.

21. The scanning apparatus of claim 19, wherein a maximum scan distance of the end effector is generally defined between maximum positions of the end effector when the first link and second link are fully extended, and wherein the maximum scan distance is larger than the predetermined scanning range of the end effector.

* * * * *